(12) United States Patent  (10) Patent No.: US 11,362,156 B2
Cai                        (45) Date of Patent:     Jun. 14, 2022

(54) PIXEL UNIT, MANUFACTURING METHOD, AND DISPLAY DEVICE FOR PROVIDING TWO DRIVING VOLTAGES

(71) Applicant: Shenzhen China Star Optoelectronics Semiconductor Display Technology Co., Ltd., Shenzhen (CN)

(72) Inventor: Zhenfei Cai, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 320 days.

(21) Appl. No.: 16/626,389

(22) PCT Filed: Dec. 16, 2019

(86) PCT No.: PCT/CN2019/125581
§ 371 (c)(1),
(2) Date: Dec. 24, 2019

(87) PCT Pub. No.: WO2021/103194
PCT Pub. Date: Jun. 3, 2021

(65) Prior Publication Data
US 2021/0408175 A1    Dec. 30, 2021

(30) Foreign Application Priority Data
Nov. 29, 2019   (CN) .......................... 201911205495.0

(51) Int. Cl.
*H01L 29/08*    (2006.01)
*H01L 27/32*    (2006.01)
(Continued)

(52) U.S. Cl.
CPC ....... *H01L 27/3246* (2013.01); *G09G 3/3258* (2013.01); *H01L 27/3262* (2013.01);
(Continued)

(58) Field of Classification Search
CPC ............. H01L 27/3246; H01L 27/3258; H01L 27/3262; H01L 27/3265; H01L 51/5072; H01L 2227/323
(Continued)

(56) References Cited

U.S. PATENT DOCUMENTS

2015/0171113 A1    6/2015  Honjo
2018/0247988 A1*   8/2018  Lee .......................... H01L 51/56
(Continued)

FOREIGN PATENT DOCUMENTS

CN    101707028    5/2010
CN    102214439   10/2011
(Continued)

*Primary Examiner* — Phuc T Dang

(57) ABSTRACT

The present invention discloses a pixel unit, a manufacturing method, and a display device. The pixel unit includes a first positive electrode layer, a first pixel definition layer disposed on the first positive electrode layer, a second positive electrode layer disposed on the first pixel definition layer, and a second pixel definition layer disposed on the second positive electrode layer such that the first positive electrode layer and the second positive electrode layer are driven individually. The present invention, by employing two anode driving voltages in the same sub-pixel, drives two parts of a light emitting material individually to improve a brightness in a central region such that the entire pixel emits light evenly.

15 Claims, 3 Drawing Sheets

(51) Int. Cl.
    *G09G 3/3258* (2016.01)
    *H01L 51/50* (2006.01)
    *H01L 51/56* (2006.01)

(52) U.S. Cl.
    CPC ...... *H01L 27/3265* (2013.01); *H01L 51/5072* (2013.01); *H01L 51/56* (2013.01); *H01L 2227/323* (2013.01)

(58) Field of Classification Search
    USPC .......................................................... 257/40
    See application file for complete search history.

(56) References Cited

U.S. PATENT DOCUMENTS

| | | | |
|---|---|---|---|
| 2019/0363146 A1* | 11/2019 | Takahashi | H01L 51/5253 |
| 2019/0363150 A1* | 11/2019 | Nomura | H01L 27/3276 |
| 2019/0386067 A1* | 12/2019 | Wei | H01L 27/3246 |

FOREIGN PATENT DOCUMENTS

| | | |
|---|---|---|
| CN | 104318902 | 1/2015 |
| CN | 106252383 | 12/2016 |
| CN | 106876426 | 6/2017 |
| CN | 207303144 | 5/2018 |
| CN | 108400154 | 8/2018 |
| CN | 108565350 | 9/2018 |
| CN | 109427856 | 3/2019 |
| CN | 109507817 | 3/2019 |
| CN | 109742107 | 5/2019 |

* cited by examiner

PIXEL UNIT, MANUFACTURING METHOD, AND DISPLAY DEVICE FOR PROVIDING TWO DRIVING VOLTAGES

RELATED APPLICATIONS

This application is a National Phase of PCT Patent Application No. PCT/CN2019/125581 having International filing date of Dec. 16, 2019, which claims the benefit of priority of Chinese Patent Application No. 201911205495.0 filed on Nov. 29, 2019. The contents of the above applications are all incorporated by reference as if fully set forth herein in their entirety.

FIELD AND BACKGROUND OF THE INVENTION

The present invention relates to a field of display technologies, especially to a pixel unit, a manufacturing method, and a display device.

BACKGROUND OF INVENTION

At present, the development of printed organic light emitting diode (OLED) is gradually mature.

Technical Issue

However, as the liquid light emitting material undergoes a change in morphology during heating and drying, after an OLED pixel structure as shown in FIG. 1 is heated and dried, a height of a material in the pixel definition layer thereof will be unevenly distributed such that a thickness of a periphery of the pixel definition layer is greater than a thickness of a center of the pixel definition layer, which causes uneven brightness, high peripheral brightness, and low intermediate brightness.

SUMMARY OF THE INVENTION

Technical Solution

The present invention provides a pixel unit, a manufacturing method, and a display device solving the issue that after an OLED pixel structure as shown in FIG. 1 is heated and dried, a height of a material in the pixel definition layer thereof will be unevenly distributed such that a thickness of a periphery of the pixel definition layer is greater than a thickness of a center of the pixel definition layer, which causes uneven brightness, high peripheral brightness, and low intermediate brightness.

In one aspect, the present invention provides a pixel unit, comprising: a first positive electrode layer, a first pixel definition layer disposed on the first positive electrode layer, a second positive electrode layer disposed on the first pixel definition layer, and a second pixel definition layer disposed on the second positive electrode layer such that the first positive electrode layer and the second positive electrode layer are driven individually.

In the pixel unit of the present invention, further comprising an underlay substrate, a light emitting unit, an electron transport layer, and a negative electrode layer; wherein the underlay substrate, the first positive electrode layer, the first pixel definition layer, the second positive electrode layer, the second pixel definition layer, the electron transport layer, and the negative electrode layer are sequentially stacked and disposed on one another, and the light emitting unit is connected to the first positive electrode layer, the first pixel definition layer, the second positive electrode layer, the second pixel definition layer, and the electron transport layer.

In the pixel unit of the present invention, the light emitting unit comprises a hole injection layer, a hole transport layer, and a light emitting layer.

In the pixel unit of the present invention, further comprising a driver circuit; wherein the driver circuit comprises a primary pixel unit and a sub-pixel unit each of which is connected to a scan line and a data line, the primary pixel unit is connected to the first positive electrode layer to provide a first driving voltage, the sub-pixel unit is connected to the second positive electrode layer to provide a second driving voltage, and a voltage value of the first driving voltage is different to a voltage value of the second driving voltage.

In the pixel unit of the present invention, the primary pixel unit comprises a first transistor, a second transistor, a third transistor, and a first capacitor; and a first end of the first transistor is connected to the data line, a second end of the first transistor is connected to the scan line, a third end of the first transistor is connected to a first end of the second transistor and an end of the first capacitor, a second end of the second transistor is connected to another end of the first capacitor, the first positive electrode layer, and a first end of the third transistor, a second end of the third transistor is connected to the scan line, and a third end of the third transistor is connected to the power line.

In the pixel unit of the present invention, the sub-pixel unit comprises a fourth transistor, a fifth transistor, and a second capacitor; and a first end of the fourth transistor is connected to the data line, a second end of the fourth transistor is connected to the scan line, a third end of the fourth transistor is connected to a first end of the fifth transistor and an end of the second capacitor, and a second end of the fifth transistor is connected to another end of the second capacitor and the second positive electrode layer.

In one aspect, a pixel circuit manufacturing method is provided and comprises:
 disposing a first positive electrode layer;
 disposing a first pixel definition layer on the first positive electrode layer;
 disposing a second positive electrode layer on the first pixel definition layer; and
 disposing a second pixel definition layer on the second positive electrode layer.

In the present invention, the manufacturing method further comprises:
 disposing an electron transport layer on second pixel definition layer; and
 connecting a light emitting unit to the first positive electrode layer, the first pixel definition layer, the second positive electrode layer, the second pixel definition layer, and the electron transport layer.

In the present invention, the manufacturing method further comprises:
 disposing an underlay substrate under the first positive electrode layer.

In one aspect, a display device is provided and comprises a pixel circuit.

Advantages

The present invention has the following advantages:

By employing two anode driving voltages in the same sub-pixel, two parts of the light emitting material are driven individually to improve a brightness in a central region such that the entire pixel emits light evenly.

BRIEF DESCRIPTION OF THE SEVERAL VIEWS OF THE DRAWINGS

The present invention will be further described below with reference to the accompanying drawings and embodiments.

DESCRIPTION OF SPECIFIC EMBODIMENTS OF THE INVENTION

To have a clearer understanding of the technical features, objectives, and effects of the present invention, specific embodiments of the present invention will now be described in detail with reference to the drawings.

Figure 1:
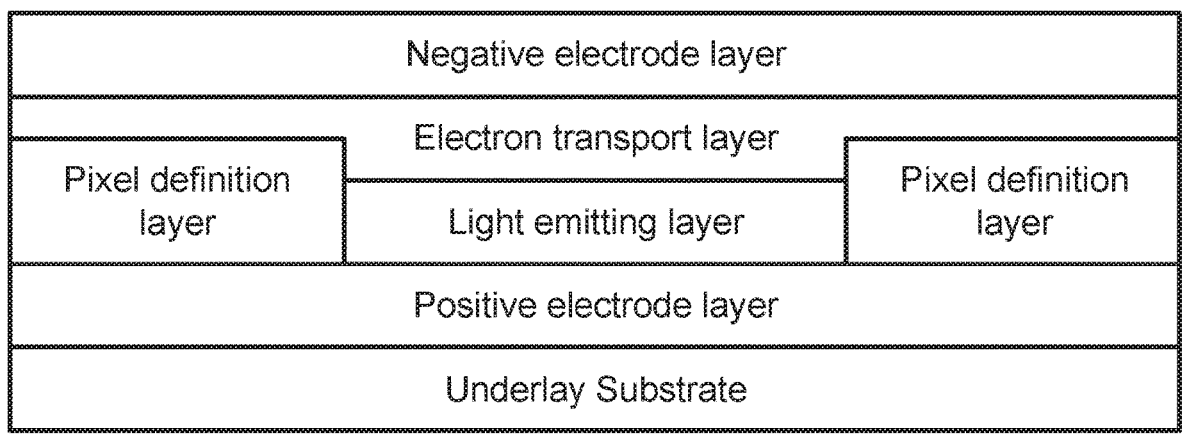
FIG. 1 is a schematic structural view of a conventional unit.
Figure 2:
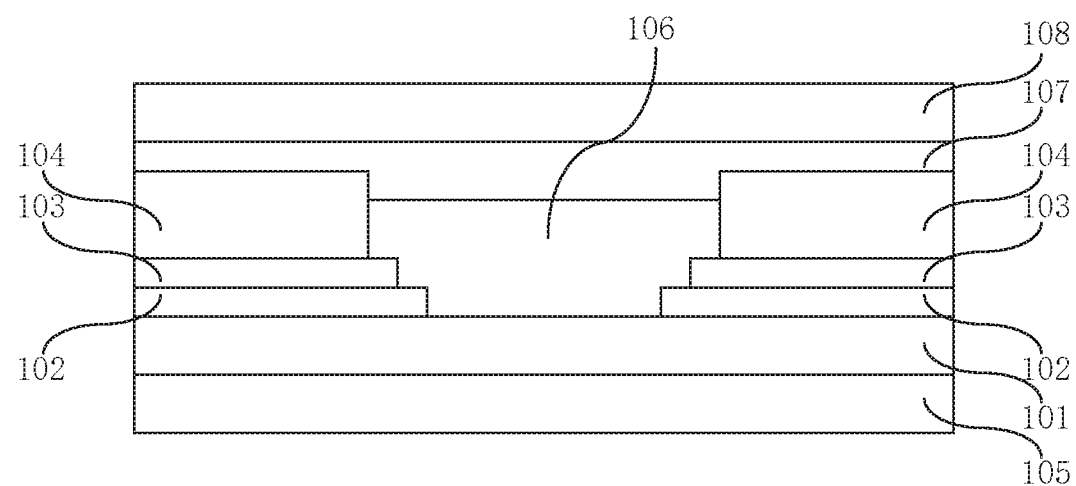
FIG. 2 is a schematic structural view of a pixel unit provided by an embodiment of the present invention.

With reference to FIG. 2, FIG. 2 is a schematic structural view of a pixel unit provided by an embodiment of the present invention. The pixel unit comprises a first positive electrode layer 101, a first pixel definition layer 102 disposed on the first positive electrode layer 101, a second positive electrode layer 103 disposed on the first pixel definition layer 102, and a second pixel definition layer 104 disposed on the second positive electrode layer 103 such that the first positive electrode layer 101 and the second positive electrode layer 103 are driven individually.

Furthermore, the pixel unit further comprises an underlay substrate 105, a light emitting unit 106, an electron transport layer 107, and a negative electrode layer 108. the underlay substrate 105, the first positive electrode layer 101, the first pixel definition layer 102, the second positive electrode layer 103, the second pixel definition layer 104, the electron transport layer 107, and the negative electrode layer 108 are sequentially stacked on and disposed on one another. The light emitting unit 106 is connected to the first positive electrode layer 101, the first pixel definition layer 102, the second positive electrode layer 103, the second pixel definition layer 104, and the electron transport layer 107. The light emitting unit 106 comprises a hole injection layer, hole transport layer and a light emitting layer.

Figure 3:
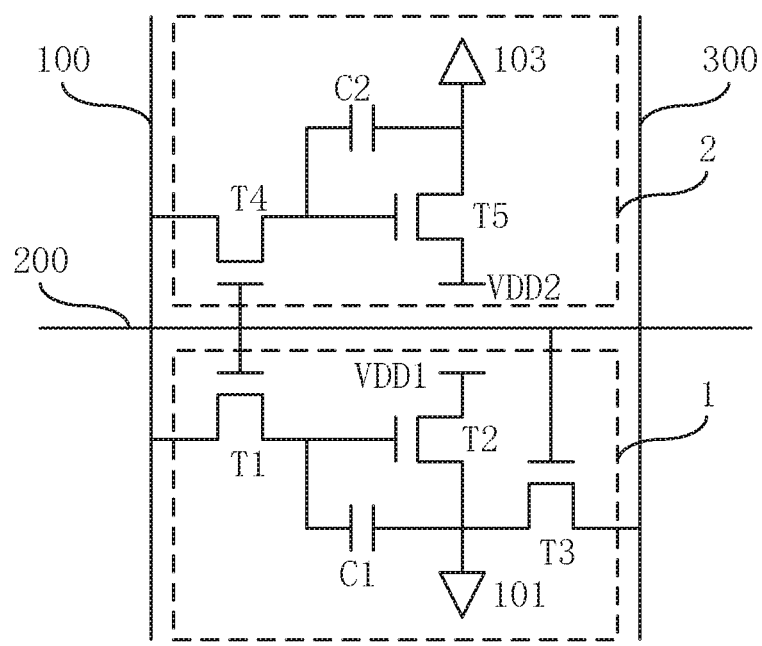
FIG. 3 is a schematic structural view of a driver circuit provided by an embodiment of the present invention.

With reference to FIG. 3, FIG. 3 is a schematic structural view of a driver circuit provided by an embodiment of the present invention. The pixel unit further comprises a driver circuit. The driver circuit comprises a primary pixel unit 1 *a* and a sub-pixel unit 2 each of which is connected to a scan line 200 and a data line 100, in other words, in the vertically disposed data line 100 and the horizontally disposed scan line 200, each of the primary pixel unit and the sub-pixel unit is connected to the scan line 200 and the data line 100. The primary pixel unit 1 is connected to the first positive electrode layer 101 to provide a first driving voltage, the sub-pixel unit 2 is connected to the second positive electrode layer 103 to provide a second driving voltage. For example, the same pixel is disposed with two driver circuits, wherein a primary pixel unit 1 is connected to the first positive electrode layer 101 to provide a driving voltage of 100%, sub-pixel unit 2 is connected to the second positive electrode layer 103 to provide a driving voltage of 80%.

The primary pixel unit 1 employs a framework of 3T1C, i.e., the framework of three transistors and one capacitor. The transistor is preferably a thin film transistor (TFT), the primary pixel unit 1 is also connected to a power line 300. The primary pixel unit 1 comprises a first transistor T1, a second transistor T2, a third transistor T3, and a first capacitor C1. A first end of the first transistor T1 is connected to the data line 100, a second end of the first transistor T1 is connected to the scan line 200, a third end of the first transistor T1 is connected to a first end of the second transistor T2 and an end of the first capacitor C1, and a second end of the second transistor T2 is connected to another end of the first capacitor C1. The first positive electrode layer 101, a first end of the third transistor T3, and a second end of the third transistor T3 are connected to the scan line 200, and a third end of the third transistor T3 is connected to the power line 300. A third end of the second transistor T2 is connected to a first voltage end VDD1.

The sub-pixel unit 2 employs a framework of 2T1C, and the sub-pixel unit 2 comprises a fourth transistor T4, a fifth transistor T5, and a second capacitor C2. A first end of the fourth transistor T4 is connected to the data line 100, a second end of the fourth transistor T4 is connected to the scan line 200, and a third end of the fourth transistor T4 is connected to a first end of the fifth transistor T5 and an end of the second capacitor C2. A second end of the fifth transistor T5 is connected to another end of the second capacitor C2 and the second positive electrode layer 103. A third end of the fifth transistor T5 is connected to second voltage end VDD2.

When the scan line 200 provides a high pressure scan signal, the same data voltage is provided simultaneously to two pixel circuits. However, the primary pixel unit 1 employs the framework of 3T1C, a power end can provide an anode with a reference voltage for resetting, a charging rate of the pixel is greater related to the sub-pixel unit 2 such that a light emission brightness is greater.

The present invention also provides a pixel circuit manufacturing method comprising steps S1-S4:

The step S1 comprises disposing a first positive electrode layer 101.

The step S2 comprises disposing a first pixel definition layer 102 on the first positive electrode layer 101.

The step S3 comprises disposing a second positive electrode layer 103 on the first pixel definition layer 102.

The step S4 comprises disposing a second pixel definition layer 104 on the second positive electrode layer 103.

Preferably, the manufacturing method further comprises steps S5-S7:

The step S3S5 comprises disposing an electron transport layer 107 on the second pixel definition layer 10.

The step S3S6 comprises disposing an underlay substrate 105 under the first positive electrode layer 101.

The step S3S7 comprises connecting light emitting unit 106 the first positive electrode layer 101, the first pixel definition layer 102, the second positive electrode layer 103, the second pixel definition layer 104, and the electron transport layer 107.

The present invention also provides a display device comprising the above pixel circuit. The display device, by employing two anode driving voltages in the same sub-pixel, drives two parts of the light emitting material individually to improve a brightness in a central region such that the entire pixel emits light evenly.

The embodiment of the present invention has been described above with reference to the accompanying drawings. However, the present invention is not limited to the specific embodiments described above, and the specific embodiments described above are merely schematic, rather than restrictive, common techniques in the art. Under the enlightenment of the present invention, a person of ordinary skill in the art can make many forms without departing from the purpose of the present invention and the scope of protection of the claims, which are all covered by the protection of the present invention.

What is claimed is:

1. A pixel unit, comprising: a first positive electrode layer, a first pixel definition layer disposed on the first positive electrode layer, a second positive electrode layer disposed on the first pixel definition layer, and a second pixel definition layer disposed on the second positive electrode layer such that the first positive electrode layer and the second positive electrode layer are driven individually.

2. The pixel unit as claimed in claim 1, further comprising an underlay substrate, a light emitting unit, an electron transport layer, and a negative electrode layer;
wherein the underlay substrate, the first positive electrode layer, the first pixel definition layer, the second positive electrode layer, the second pixel definition layer, the electron transport layer, and the negative electrode layer are sequentially stacked and disposed on one another, and the light emitting unit is connected to the first positive electrode layer, the first pixel definition layer, the second positive electrode layer, the second pixel definition layer, and the electron transport layer.

3. The pixel unit as claimed in claim 2, wherein the light emitting unit comprises a hole injection layer, a hole transport layer, and a light emitting layer.

4. The pixel unit as claimed in claim 1, further comprising a driver circuit;
wherein the driver circuit comprises a primary pixel unit and a sub-pixel unit each of which is connected to a scan line and a data line, the primary pixel unit is connected to the first positive electrode layer to provide a first driving voltage, the sub-pixel unit is connected to the second positive electrode layer to provide a second driving voltage, and a voltage value of the first driving voltage is different to a voltage value of the second driving voltage.

5. The pixel unit as claimed in claim 4, wherein
the primary pixel unit comprises a first transistor, a second transistor, a third transistor, and a first capacitor; and
a first end of the first transistor is connected to the data line, a second end of the first transistor is connected to the scan line, a third end of the first transistor is connected to a first end of the second transistor and an end of the first capacitor, a second end of the second transistor is connected to another end of the first capacitor, the first positive electrode layer, and a first end of the third transistor, a second end of the third transistor is connected to the scan line, and a third end of the third transistor is connected to the power line.

6. The pixel unit as claimed in claim 4, wherein
the sub-pixel unit comprises a fourth transistor, a fifth transistor, and a second capacitor; and
a first end of the fourth transistor is connected to the data line, a second end of the fourth transistor is connected to the scan line, a third end of the fourth transistor is connected to a first end of the fifth transistor and an end of the second capacitor, and a second end of the fifth transistor is connected to another end of the second capacitor and the second positive electrode layer.

7. A pixel circuit manufacturing method, comprising:
disposing a first positive electrode layer;
disposing a first pixel definition layer on the first positive electrode layer;
disposing a second positive electrode layer on the first pixel definition layer; and
disposing a second pixel definition layer on the second positive electrode layer.

8. The manufacturing method as claimed in claim 7, further comprising:
disposing an electron transport layer on second pixel definition layer; and
connecting a light emitting unit to the first positive electrode layer, the first pixel definition layer, the second positive electrode layer, the second pixel definition layer, and the electron transport layer.

9. The manufacturing method as claimed in claim 7, further comprising:
disposing an underlay substrate under the first positive electrode layer.

10. A display device, comprising a pixel circuit; the pixel circuit comprises a first positive electrode layer, a first pixel definition layer disposed on the first positive electrode layer, a second positive electrode layer disposed on the first pixel definition layer, and a second pixel definition layer disposed on the second positive electrode layer such that the first positive electrode layer and the second positive electrode layer re driven individually.

11. The display device as claimed in claim 10, further comprising an underlay substrate, a light emitting unit, an electron transport layer, and a negative electrode layer;
wherein the underlay substrate, the first positive electrode layer, the first pixel definition layer, the second positive electrode layer, the second pixel definition layer, the electron transport layer, and the negative electrode layer are sequentially stacked and disposed on one another, and the light emitting unit is connected to the first positive electrode layer, the first pixel definition layer, the second positive electrode layer, the second pixel definition layer, and the electron transport layer.

12. The display device as claimed in claim 11, wherein the light emitting unit comprises a hole injection layer, a hole transport layer, and a light emitting layer.

13. The display device as claimed in claim 10, further comprising a driver circuit;
wherein the driver circuit comprises a primary pixel unit and a sub-pixel unit each of which is connected to a scan line and a data line, the primary pixel unit is connected to the first positive electrode layer to provide a first driving voltage, the sub-pixel unit is connected to the second positive electrode layer to provide a second driving voltage, and a voltage value of the first driving voltage is different to a voltage value of the second driving voltage.

14. The display device as claimed in claim 13, wherein
the primary pixel unit comprises a first transistor, a second transistor, a third transistor, and a first capacitor; and
a first end of the first transistor is connected to the data line, a second end of the first transistor is connected to the scan line, a third end of the first transistor is connected to a first end of the second transistor and an end of the first capacitor, a second end of the second transistor is connected to another end of the first capacitor, the first positive electrode layer, and a first end of the third transistor, a second end of the third transistor is connected to the scan line, and a third end of the third transistor is connected to the power line.

15. The display device as claimed in claim 13,
the sub-pixel unit comprises a fourth transistor, a fifth transistor, and a second capacitor; and
a first end of the fourth transistor is connected to the data line, a second end of the fourth transistor is connected to the scan line, a third end of the fourth transistor is connected to a first end of the fifth transistor and an end of the second capacitor, and a second end of the fifth transistor is connected to another end of the second capacitor and the second positive electrode layer.

* * * * *